(12) United States Patent
Prince et al.

(10) Patent No.: US 6,777,729 B1
(45) Date of Patent: Aug. 17, 2004

(54) SEMICONDUCTOR PHOTODIODE WITH BACK CONTACTS

(75) Inventors: Chad Prince, Torrance, CA (US); Raj Korde, San Pedro, CA (US)

(73) Assignee: International Radiation Detectors, Inc., Torrance, CA (US)

( * ) Notice: Subject to any disclaimer, the term of this patent is extended or adjusted under 35 U.S.C. 154(b) by 0 days.

(21) Appl. No.: 10/254,369

(22) Filed: Sep. 25, 2002

(51) Int. Cl.[7] .............................................. H01L 21/00
(52) U.S. Cl. ...................... 257/292; 257/461; 257/466; 438/57; 438/237
(58) Field of Search ..................... 257/20–24, 184–192, 257/292–293, 431–436, 461–466; 438/48–60, 237

(56) References Cited

U.S. PATENT DOCUMENTS 5,067,985 A   11/1991  Carver et al.
6,066,510 A  *  5/2000  Merrill ......................... 438/57
2003/0054585 A1 * 3/2003  Mabuchi ....................... 438/69

\* cited by examiner

*Primary Examiner*—H. Jey Tsai

(57) ABSTRACT

A radiometric quality semiconductor photodiode with one electrical contact extending from a p-n junction at the photodiode surface to the back of the photodiode substrate and a second contact formed on the back of the semiconductor substrate is provided and a method for manufacturing is presented. The electrical contact channel extending from the p-n junction to the photodiode substrate will be formed by dry etching and will require a cross sectional area of only 0.125 mm×0.125 mm.

2 Claims, 4 Drawing Sheets

SEMICONDUCTOR PHOTODIODE WITH BACK CONTACTS

FEDERALLY SPONSORED RESEARCH

Not Applicable

SEQUENCE LISTING OR PROGRAM

Not Applicable

BACKGROUND

1. Field of Invention

This invention relates, in general, to semiconductor photodiodes, and more specifically to a semiconductor photodiode having one electrical contact that extends from a p-n junction at the surface of the photodiode to the back of the photodiode substrate and a second electrical contact located of the back of the photodiode substrate.

2. Description of Prior Art

A photodiode detector is broadly defined as a device that responds to incident electromagnetic radiation by converting the radiation into electrical energy, thereby enabling measurement of the intensity of the incident radiation. Usually, a photodiode structure requires a small wire to be bonded to the electrical contact on the top surface of the photodiode. This wire must extend above the photodiode surface and only touch the surface at the electrical contact point. These wires (normally referred to as wire bonds) are very delicate, prone to damage and limit the proximity that a photodiode can be to a surface. In some applications, such as x-ray, extreme ultraviolet and deep ultraviolet (XUV radiation) steppers, it is desirable to place the detector within a few micrometers to a given surface for dosimetry, imaging, position sensing and alignment applications. Wire bonds on the front surface of the photodiode, which typically are 1 millimeter high, will not allow this.

Photodiodes used as solar cells have been manufactured with electrical contacts on the back surface opposing the front active area (back contact devices) (citation #1). According to Smith et. al. (citation #2), there are three design categories of back contact cells, the Interdigitated Back-Contact (IBC) solar cell, the Emitter Wrap-Through (EWT) solar cell, and the contact wrap-through (CWT) solar cell.

Both the IBC solar cell and the CWT solar cell are not suitable designs for making a photodiode for XUV radiation detection. The IBC solar cell does not have an electrical contact that extends to the front surface of the diode which is needed for XUV photon detection. It is essential for XUV photodiodes to have the p-n junction formed near the surface as XUV radiation is absorbed within a fraction of a micron from the surface. The CWT solar cells have a metal grid on the cell surface which reduces the sensitivity of the cell. For many applications (mainly radiometric), it is desirable to have an XUV photodiode with very high sensitivity without any radiation absorbing structure on the active surface. Although the CWT solar cells have holes for front to back contact, the holes create an additional problem in realizing the XUV photodiodes as explained in the next paragraph. The buried contact EWT cell was one of the earliest versions developed. It uses laser drilled holes from front to back of the cell as well as laser cut channels for contact plating. The problem with this method is that the holes in the wafer will make it almost impossible to pattern wafers using photolithography techniques needed for the above mentioned applications. Several patterning steps are required to realize an XUV photodiode after formation of the front to back contact.

Fabrication of the back contact vertical junction solar cells have been described in U.S. Pat. No. 5,067,985 (citation # P1). Special (110) oriented silicon wafers were chosen and chemical etching was used to form a network of narrow channels into which impurities were diffused. Then a conducting material was deposited into the channels to form back contacts. (110) oriented silicon is useful only when long narrow channels are needed as in the solar cell structures. Small channel areas like those required in dense photodiode arrays can not be realized by wet chemical etching techniques.

We have made back contact photodiodes for x-ray steppers several years ago in which the holes in the wafer were formed by wet chemical etching through which the front contact was brought to the back of the photodiode. In this method, an area of about 0.75 mm×0.75 mm is needed to achieve the desired results. Hence, the photodiodes on the front of the wafer can not be placed closer than about a millimeter to each other, an undesirable feature when a photodiode dense array is desired for imaging purposes.

An obvious approach to avoid the use of wire bonds would be to mount the front surface of the diode onto a ceramic substrate and illuminate the diode from the back (citation #3). High XUV response of back illuminated devices dictates that the devices need to be thin so that the photogenerated carriers can diffuse to the front region. However, radiation hardness as that required by XUV photodiodes, has so far, not been demonstrated by the thin devices (citation #4).

A brute force approach used in some silicon controlled rectifier (thyristor) manufacturing processes, is to carry out the dopant diffusion in desired areas from the front and back of the wafer simultaneously. When the front and back diffusions meet, they form a conductive channel extending from the front of the device to the back of the device. However, temperatures in excess of 1200° C. and diffusion time in excess of a week are required to achieve the desired results. Such a high temperature and prolonged process time is known to mechanically deform the silicon wafers. If the wafers are deformed, it will be impossible to perform the submicron geometry patterning needed for the above XUV stepper applications.

OBJECTS AND ADVANTAGES

Accordingly, it is an object of the present invention to provide a radiometric quality semiconductor photodiode with shallow p-n junction having one electrical contact through a small channel extending from the p-n junction to the back of the photodiode substrate and a second contact formed on the back of the semiconductor substrate. The electrical contact channel requires a cross sectional area of only 0.125 mm×0.125 mm with the present technology and can be made smaller as the semiconductor etching technology develops further.

Another object of the present invention is to provide a method of manufacturing a radiometric quality semiconductor photodiode with shallow p-n junction having one electrical contact through a small channel extending from the p-n junction to the back of the photodiode substrate and a second contact formed on the back of the semiconductor substrate. In the method proposed, the electrical contact channel will require a cross sectional area of only 0.125 mm×0.125 mm.

SUMMARY OF THE INVENTION

These and other objects and advantages are provided by a radiometric quality semiconductor photodiode with one electrical contact extending from a p-n junction at the photodiode surface to the back of the photodiode substrate and a second contact formed on the back of the semiconductor substrate. With the present technology, the electrical contact channel will require a cross sectional area of only 0.125 mm×0.125 mm.

This photodiode with back contacts will eliminate the need for delicate wire bonds which are prone to damage during handling and will also allow the photodiode to be placed extremely close to a surface. Because of the small contact channel area of 0.125 mm×0.125 mm, dense photodiode arrays can be manufactured.

A novel approach to accomplish this will require the formation of a channel by dry etching that will extend from back of the photodiode substrate to close to the p-n junction at the front of the photodiode. Impurities will then be diffused radially outward from the channel to provide an electrical pathway from the p-n junction to the back of the substrate. Dry etching will provide precise control of channel depth close to the photodiode front surface which would not be achievable with laser drilling as used in the prior art. This will provide a means for manufacturing a radiometric quality photodiode suitable for the previously mentioned applications.

According to one embodiment, the present invention comprises a radiometric quality semiconductor photodiode with shallow p-n junction having one electrical contact through a small channel extending from a p-n junction at the photodiode surface to the back of the photodiode substrate and a second contact formed on the back of the semiconductor substrate.

In another embodiment, the present invention comprises a method of making a radiometric quality semiconductor photodiode with shallow p-n junction having one electrical contact with a small channel extending from a p-n junction at the photodiode surface to the back of the photodiode substrate and a second contact formed on the back of the semiconductor substrate. The method comprises fabrication of a radiometric quality semiconductor photodiode having one electrical contact extending from a shallow p-n junction to the back of the photodiode substrate and with a second contact formed on the back of the semiconductor substrate by using techniques of photolithography and dry etching presently used in the semiconductor industry.

DETAILED DESCRIPTION OF THE PREFERED EMBODIMENTS

Figure 1:
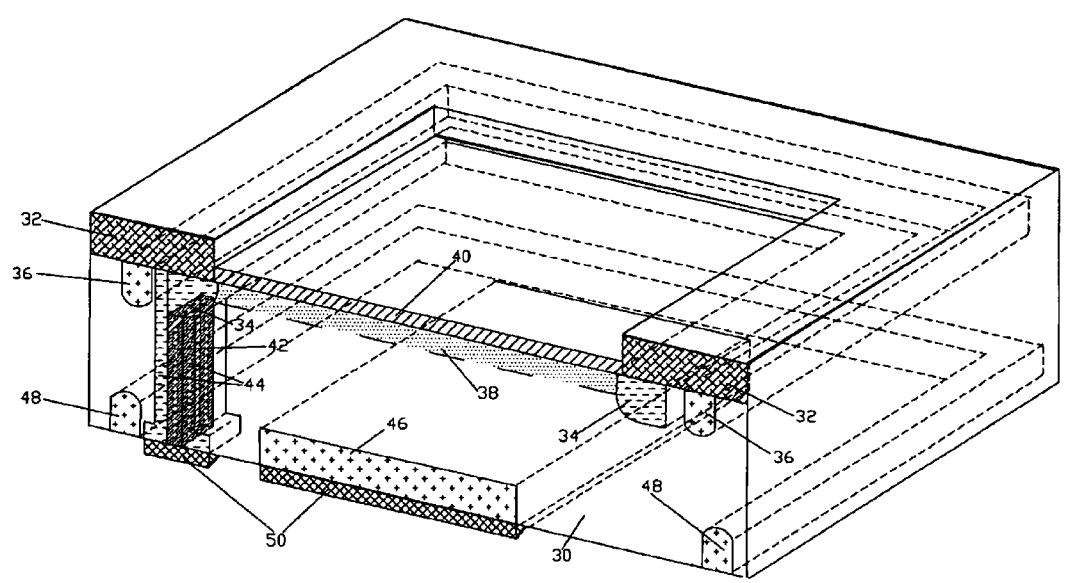
FIG. 1 illustrates the isometric view of one embodiment of the photodiode with back contacts.

FIG. 1 (not to scale) illustrates an isometric view of a photodiode with back contacts. The photodiode can be fabricated by an ULSI (Ultra Large Scale Integrated Circuit) compatible process. A substrate 30 comprises a semiconductor material that is doped p-type. It should be understood that either n- or p-type conductivity can be used so long as junctions are formed with the proper dopant type as described herein below. A field oxide layer 32 is located on the substrate. An n+ guard ring region 34 and a p+ channel stop region 36 are located on the substrate. A defect free n-type active region 38 is located on the front of the substrate. A passivating front window oxide layer or metal silicide layer 40 is located on the substrate. A channel 42 is etched into the back of the substrate extending to within 10 to 100 microns of the front surface. An n+ region 44 is located in the substrate surrounding the etched channel and extending to the bottom of the substrate that will bring the front n-region to the back. A p+ ohmic contact region 46 is located on the bottom of the substrate. Another p+ channel stop region 48 is located on the back of the substrate. Gold for electrical contacts 50 is located on the back of the substrate.

Figure 2:
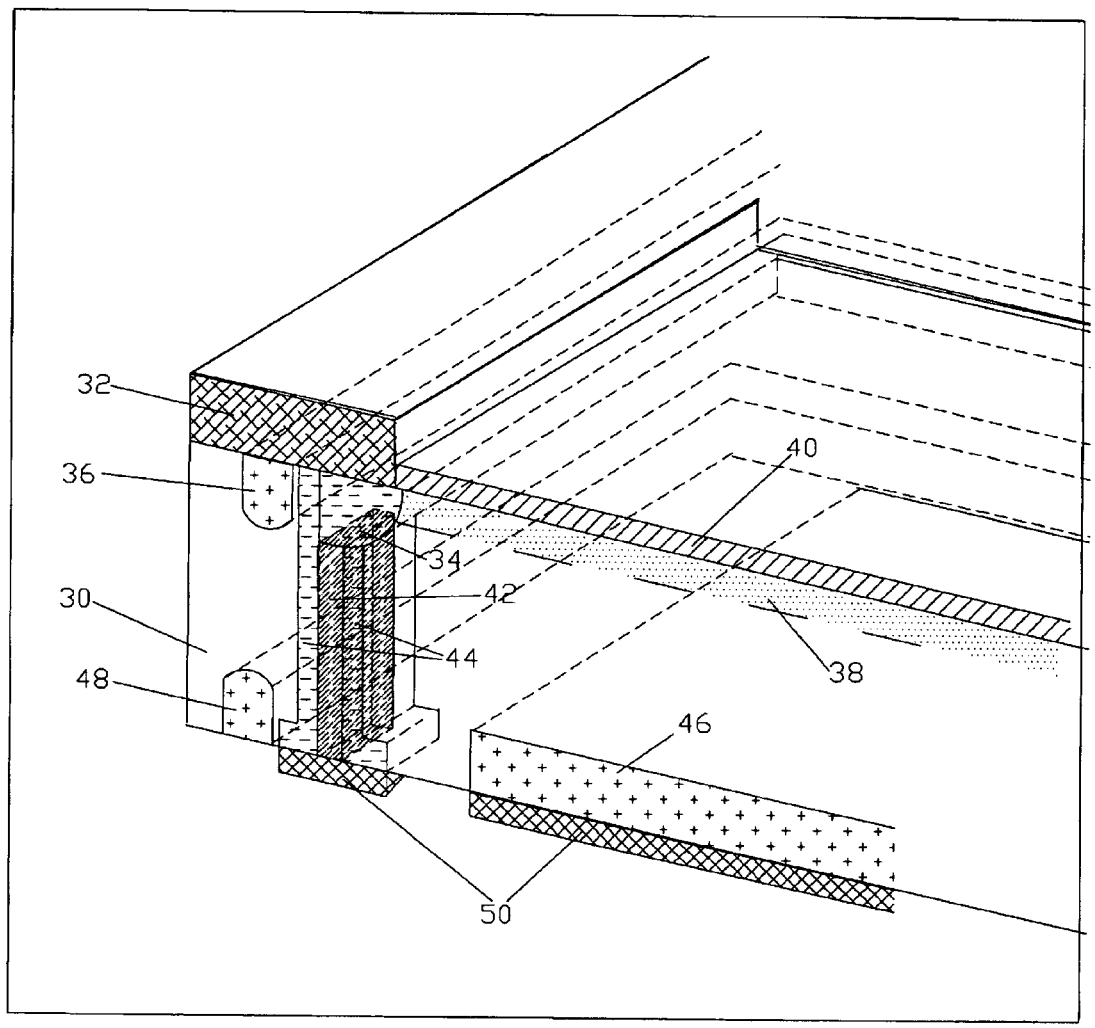
FIG. 2 illustrates an enlarged subsection of the photodiode with back contacts.

FIG. 2 (not to scale) shows an enlarged subsection of the photodiode with back contacts shown in FIG. 1 and emphasizes the area in which the back contacts are formed.

Figure 3:
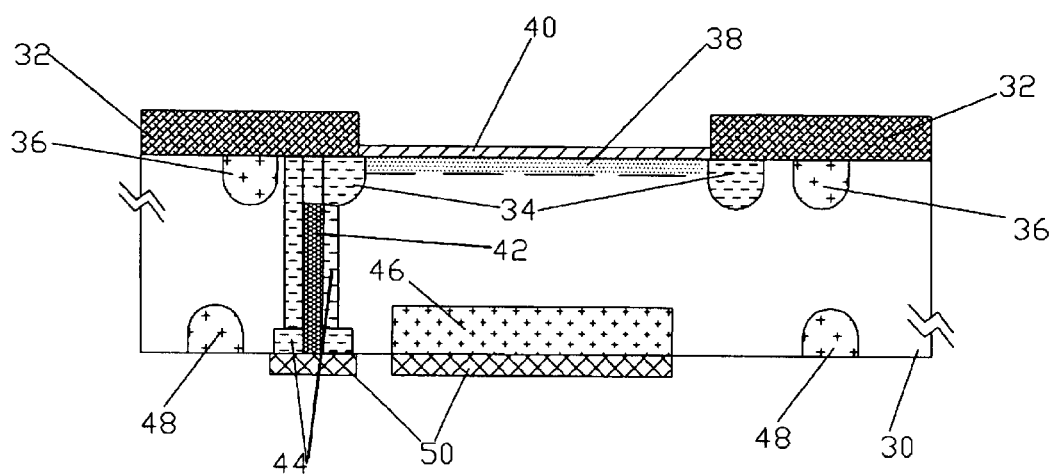
FIG. 3 illustrates the cross section of the photodiode with back contacts.

FIG. 3 (not to scale) illustrates a cross section of the photodiode with back contacts shown in FIG. 1.

Figure 4:
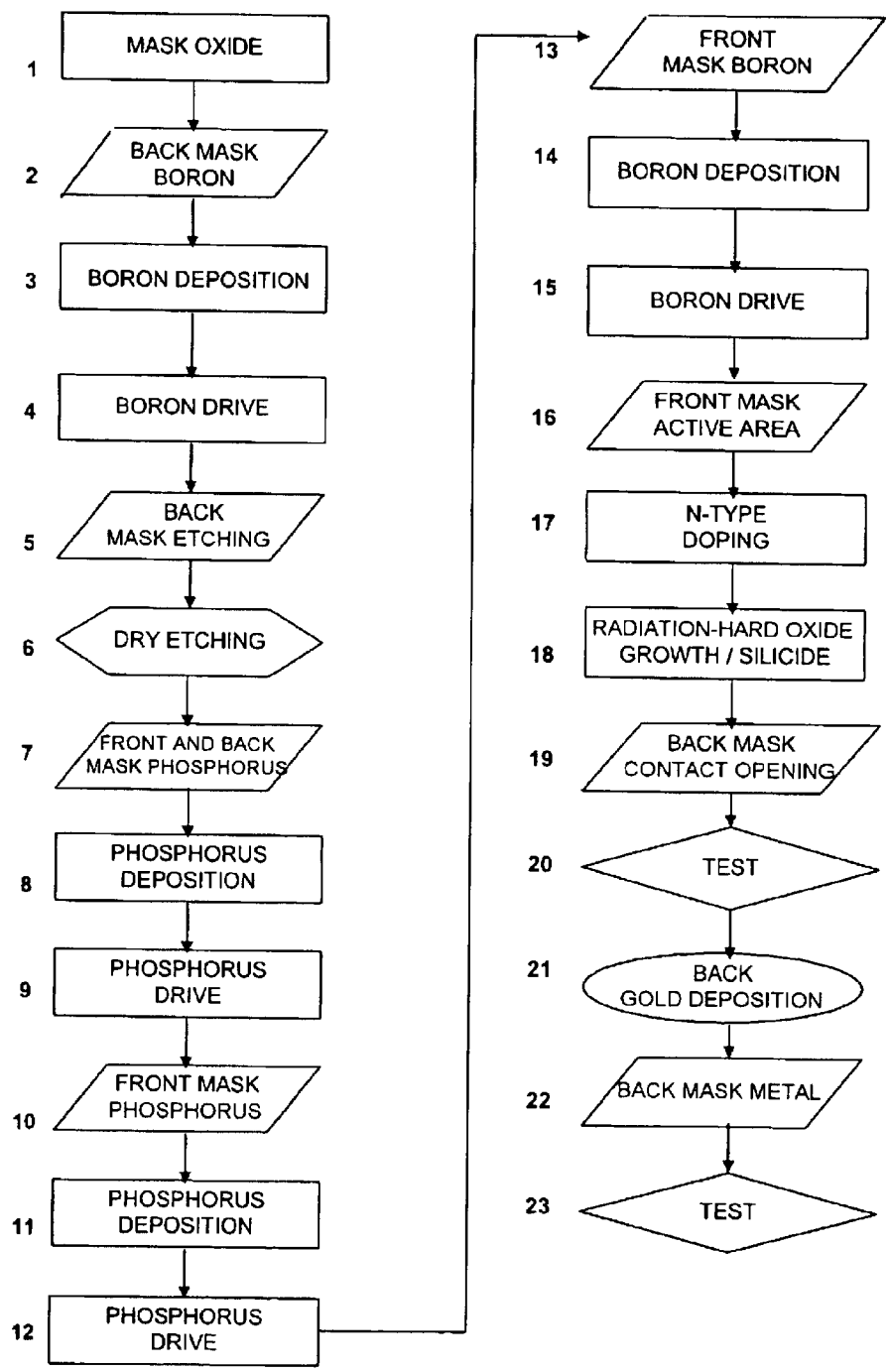
FIG. 4 illustrates the process by which one embodiment of the photodiode with back contacts may be produced.

FIG. 4 illustrates one process of manufacturing a photodiode with back contacts as follows:

Step 1 forms a field oxide over the surface of a semiconductor substrate. This oxide acts as a masking layer during diffusion/implantation.

Steps 2 through step 4 form p+ regions on the back of the substrate which act as ohmic contact regions and channel stop regions. Although, a diffusion process for boron doping is described here, other doping techniques commonly used in the semiconductor industry such as ion implantation can also be used.

Step 5 and step 6 are photolithography and dry etch steps which form a channel in the substrate extending from the back of the photodiode to within 10 to 100 microns of the front surface.

Step 7 through step 9 form an n+ region around the channel created in steps 5 and 6. When n-type dopant is introduced into the etched channel, it will diffuse radially and vertically into the substrate creating an electrical pathway from the front junction (to be formed) to the back contact.

Steps 10 through step 12 form an n+ region around the photodiode active area which acts as a guard ring that reduces the diode leakage current.

Step 13 through step 15 form the p+ region on the top surface of the photodiode which act as a channel stop.

Step 16 and 17 form an active area of the photodiode with shallow n-type doping in the p-substrate.

Step 18 forms a radiation hard oxide layer or metal silicide layer on the surface of the active area which acts as a passivating layer as well as an entrance window to radiation.

Step 19, 21, and 22 form electrical contacts on the back of the substrate.

Step 20 and step 23 verify that the desired electrical characteristics have been achieved.

SUMMARY

A variety of modifications of the present invention will be obvious to those of ordinary skill in photodetector design and fabrication. A photodiode with back contacts can be made from many different types of semiconductor materials including Si, GaN or SiC. Different processing techniques to form the photodiode with back contacts may be developed to achieve similar or better results as those presented here. Although the FIG. 4 process flow chart describes the use of diffusion for doping, other semiconductor doping techniques like ion implantation can also be used to form the n- and p-type regions mentioned.

It should now be apparent that a semiconductor photodiode having one electrical contact that extends from a p-n junction at the surface of the photodiode to the back of the photodiode substrate and the second contact formed on the back of the semiconductor substrate is provided and a process for manufacturing the invention is presented. This invention will provide the ability to place a photodiode extremely close to a surface. It will also provide a more durable device by eliminating the use of delicate wire bonds for electrical contacts. The manufacturing process presented consists of techniques that are well known in the semiconductor industry.

We claim:

1. A semiconductor photodiode comprising a semiconductor substrate in which a p-n junction is formed and incident radiation energy can generate charge carriers separable by an electric field generated by said p-n junction and said carriers are conductible by first and second electrically conductive contacts, where said first electrical contact extends from said p-n junction near the surface of said photodiode to the back of said photodiode substrate, and said first electrical contact has an etched contact channel which extends from the back of said photodiode substrate to within 10 to 100 microns of said photodiode surface with cross sectional area of said channel having the dimensions of about 0.125 mm×0.125 mm, and said second electrical contact is located on the back of said photodiode substrate.

2. A method for the fabrication of a semiconductor photodiode comprising a semiconductor substrate in which a p-n junction is formed and incident radiation energy can generate charge carriers separable by an electric field generated by said p-n junction and said carriers are conductible by first and second electrically conductive contacts, and said first electrical contact extends from said p-n junction near the surface of said photodiode to the back of said photodiode substrate, and said first electrical contact has an etched contact channel which extends from the back of said photodiode substrate to within 10 to 100 microns of said photodiode surface with cross sectional area of said channel having the dimensions of about 0.125 mm×0.125 mm and is created by a combination of masking, dry etching and diffusion, and said second electrical contact is located on the back of said substrate of said photodiode and is created by standard photolithography and doping techniques.

* * * * *